US012666872B2

(12) United States Patent　　(10) Patent No.:　US 12,666,872 B2
　　Camlica　　　　　　　　　　　　(45) Date of Patent:　　Jun. 23, 2026

(54) ACTUATOR MECHANISM

(71) Applicant: TUSAS-TURK HAVACILIK VE UZAY SANAYII ANONIM SIRKETI, Ankara (TR)

(72) Inventor: Fahri Bugra Camlica, Ankara (TR)

(73) Assignee: TUSAS-TURK HAVACILIK VE UZAY SANAYII ANONIM SIRKETI, Ankara (TR)

( * ) Notice: Subject to any disclaimer, the term of this patent is extended or adjusted under 35 U.S.C. 154(b) by 829 days.

(21) Appl. No.: 18/016,406

(22) PCT Filed: Apr. 26, 2021

(86) PCT No.: PCT/TR2021/050385
　　§ 371 (c)(1),
　　(2) Date: Jan. 16, 2023

(87) PCT Pub. No.: WO2022/019858
　　PCT Pub. Date: Jan. 27, 2022

(65) Prior Publication Data
　　US 2023/0292619 A1　　Sep. 14, 2023

(30) Foreign Application Priority Data
　　Jul. 23, 2020　　(TR) ................................. 2020/11723

(51) Int. Cl.
　　*H10N 30/20*　　　　(2023.01)
　　*H10N 30/857*　　　(2023.01)
(52) U.S. Cl.
　　CPC ......... *H10N 30/206* (2023.02); *H10N 30/857* (2023.02)

(58) Field of Classification Search
　　CPC .... H10N 30/206; H10N 30/857; H10N 30/20; F03G 7/0121; F03G 7/025
　　USPC .......................................................... 310/311
　　See application file for complete search history.

(56) References Cited

U.S. PATENT DOCUMENTS

| | | | |
|---|---|---|---|
| 6,545,384 B1 | 4/2003 | Pelrine et al. | |
| 2009/0162199 A1 | 6/2009 | Bernhard | |
| 2017/0203829 A1 | 7/2017 | Brown et al. | |
| 2021/0115220 A1* | 4/2021 | Rajagopalan | ........ C09D 129/04 |

FOREIGN PATENT DOCUMENTS

| | | |
|---|---|---|
| EP | 2233735 A2 | 9/2010 |
| WO | 2013015503 A1 | 1/2013 |

OTHER PUBLICATIONS

International Search Report and Written Opinion for PCT application No. PCT/TR2021/050385, mailed Oct. 20, 2021.

(Continued)

*Primary Examiner* — Jorge L Salazar, Jr.

(74) *Attorney, Agent, or Firm* — Notaro, Michalos & Zaccaria P.C.

(57) ABSTRACT

An actuator mechanism having body, at least one actuator made of an electro-active polymer material which changes form depending on the electrical energy so that it triggers the body, at least two reinforcers which allow the actuator to change form are positioned on the actuator such that they remain opposite to each other and are connected to the actuator by clamping, thus transmitting movement to the body.

11 Claims, 3 Drawing Sheets

(56)             References Cited

OTHER PUBLICATIONS

International Preliminary Report on Patentability, completed Dec. 13, 2022.
Demand/Request for Preliminary Examination dated May 23, 2022.
International Application Status Report generated Jan. 9, 2023.
Written Opinion of International Preliminary Examining Authority mailed Oct. 13, 2022.
Response to Office Action dated Nov. 10, 2022.

* cited by examiner

ACTUATOR MECHANISM

TECHNICAL FIELD

The present invention relates to an actuator mechanism which comprises a gripper suitable for use in elastomeric actuators.

BACKGROUND

Smart materials are among the topics that are becoming widespread and actively studied. In time, theoretical studies on this topic have been implemented with practical applications. Dielectric elastomer materials from smart materials, known as artificial muscles, allow the material to be used without volume, shape or size limit. Dielectric Elastomer Actuators (DEA) consist of an elastomeric film with a dielectric structure, wherein since volume of the elastomeric film does not change, it meets the necessary force requirement and generates force when voltage is applied to the conductive material coated on both surfaces or operates with the principle of generating electrical energy when force is applied thereon. Dielectric Elastomer Actuators convert electrical energy into mechanical energy. Dielectric elastomeric actuators, which have a wide range of use, are among the preferred actuators in the fields of artificial muscle, robotic, land, sea and aviation.

Moreover, the dielectric elastomer actuator can be used to dampen vibration of sensitive devices and, when necessary, can generate currents for control purposes as it is capable of converting the force into electrical energy.

An article from the People's Republic of China titled "Modelling of dielectric elastomer as electromechanical resonator", which is included in the known-state of the art, published in 2014, comprises a fixed membrane placed between a double slide rail mechanism and a dielectric elastomer actuator that can move back and forth on the rail.

The U.S. Pat. No. 6,545,384B1 relates to transducers, their use and fabrication. The transducers convert between mechanical and electrical energy. The some transducers include a pre-strained polymer. The pre-strain improves the mechanical response of an electroactive polymer relative to a non-strained polymer. The pre-strain may vary in different directions of a polymer to vary response of the polymer to the applied voltage.

In another published application no. WO2013015503A1 discloses a composite actuator prepared by mixing a smart material with a directional material and/or soft matrix. Said composite actuator comprises a smart material whose shape is changeable based on an external signal; a directional material for restricting deformation in a specific direction; and a matrix for supporting the smart material and directional material, and determining an external shape the smart soft composite. The said smart material is positioned inside the matrix or in a surface of the matrix.

In another published application no. EP2233735A2 discloses a wind turbine blade and a piezoelectric-based actuator. The wind turbine blade is containing a movable tail structure. Said piezoelectric actuator is used to move the tail. The movement of the actuator is linear movement. With this movement, the tail is provided to move at an angle with respect to the body of the wind turbine blade.

Yet another United States patent document no. US2017203829A1, a training system capable of performing work is disclosed. The training system has a shape memory alloy (SMA) actuator exhibiting a generally planar transformational behavior. The system further has one or more heating elements for transforming the SMA actuator from an original shape to a trained shape, thereby performing work.

Another United States patent document no. US2009162199A1, a self-locking trim tab is disclosed. The trim tab assembly includes first and second shape memory alloy (SMA) actuators and a trim tab substrate which provide elastic/plastic locking in response to an induced strain actuation.

SUMMARY OF THE INVENTION

Thanks to an actuator mechanism developed with this invention, the actuator can be used instead of a metal force generator in narrow spaces where low force is required and wherever there is a low weight requirement, wherein a more efficient use is possible due to the gripper in the actuator. A more convenient mechanism is created for the elastomeric film to become flat, with the gripper operating in harmony with the actuator geometries.

Another object of the present invention is to provide an elastomeric actuator consisting of layers with dielectric elastomer property. Actuators located between electrodes can consist of one or more layers.

A further object of the present invention is to provide a more reliable and efficient actuator mechanism, which has a better performance.

The actuator mechanism realized to achieve the object of the invention and defined in the first claim and the claims dependent thereon is constructed by connecting the actuators with each other by clamping on two opposite sides, wherein the actuators are called as elastomeric film, have an insulating and flexible structure, and are made of electro-active polymer material. By means of the electric field generated on the elastomeric film by the voltage applied to the electrodes located on bottom and top of the elastomeric films, the elastomeric film is stretched by expanding and contracting at the parts where it is connected to reinforcers. Once the elastomeric film has extended towards the reinforcers by contracting, sides of the elastomeric film that are not connected to the reinforcers can be concave under the effect of internal force.

The actuator mechanism of the invention comprises a gripper which extends along the whole length of the actuators and have a form-fitting structure with the actuator. When energized, sides of the elastomeric film stretched towards the reinforcers, which are not connected to the reinforcers, may be concave under the effect of the internal force. To eliminate this, sides of the elastomeric film that are not clamped with the reinforcers are supported by the gripper. Therefore, it is possible to flatten the elastomeric film. In addition, the actuator is enabled to have a geometrical form desired by the user.

In an embodiment of the invention, the actuator mechanism has a first position in which the actuator is not energised and retracts itself in the free state such that it is brought into the previous position; and a second position in which the actuator is energised such that it is triggered to expand towards the reinforcers in a direction that the actuator is connected to the reinforcers. The mechanism comprises a gripper which changes shape in a manner fitting to the actuator, wherein the gripper prevents the sides of the actuator, which are not connected to the reinforcers, from having a concave form due to the internal force when the actuator is switched from the first position to the second position by energizing the actuator, so that the sides are flat and the actuator is fixed.

In an embodiment of the invention, the actuator mechanism comprises a gripper extending longitudinally between two reinforcers located opposite to each other. In this way, by making direct contact with the actuator, it resists the shape change of the actuator and increases the actuator performance. In addition, it is enabled to hold the actuator by compressing.

In an embodiment of the invention, the actuator mechanism comprises a plurality of grippers located on the sides of the actuator so as to form an interface with the actuator, wherein one end of the gripper is connected to the reinforcer and the other end is connected to the other reinforcer. Thus, the actuator is enabled to become flat.

In an embodiment of the invention, the actuator mechanism comprises a gripper which can be produced in different geometries depending on the way the actuator changes its shape. Thus, a more corresponding structure with the actuator is obtained, and resistance of the actuator is increased.

In an embodiment of the invention, the actuator mechanism comprises a gripper of which the portion contacting with the actuator is serrated, thus adhering to the actuator in a better way.

In an embodiment of the invention, the actuator mechanism comprises a gripper which changes shape in a form-fitting manner with the energized actuator, and has a concave and/or convex form.

In an embodiment of the invention, the actuator mechanism comprises a flexible gripper made of an elastic material, which can change shape in a form-fitting manner with the actuator.

In an embodiment of the invention, the actuator mechanism comprises electrodes located at the bottom and top of the actuator, allowing formation of an electric field on the actuator when voltage is applied thereon.

In an embodiment of the invention, the actuator mechanism comprises an actuator which is an elastomeric film made of a dielectric elastomer material. Thus, it becomes a Dielectric Elastomer Actuator (DEA) so that it converts electrical energy to mechanical work.

In an embodiment of the invention, the actuator mechanism comprises an actuator made of a silicon/graphite, carbon and/or silver-based material. Thus, electrical conductivity of the actuator is increased.

In an embodiment of the invention, the actuator mechanism comprises an actuator which changes shape according to the commands received from a user. A control unit enables the actuator to change shape.

In an embodiment of the invention, the actuator mechanism comprises a body suitable for use in air and/or space vehicles.

In an embodiment of the invention, the actuator mechanism comprises a body suitable for use as a control surface in air and/or space vehicles.

The actuator mechanism realized to achieve the object of the present invention is illustrated in the attached drawings, in which:

Figure 1:
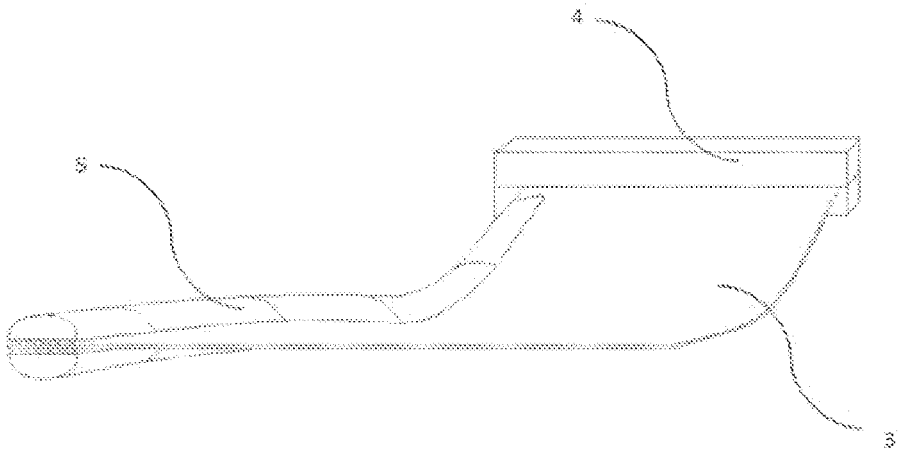
FIG. 1 is a perspective of the gripper.

All the parts illustrated in figures are individually assigned a reference numeral and the corresponding terms of these numbers are listed below:

1. Actuator Mechanism
2. Body
3. Actuator
4. Reinforcer
5. Gripper
6. Control Unit
7. Electrode
    (I) First Position
    (II) Second Position

DETAILED DESCRIPTION OF THE INVENTION

Figure 2:
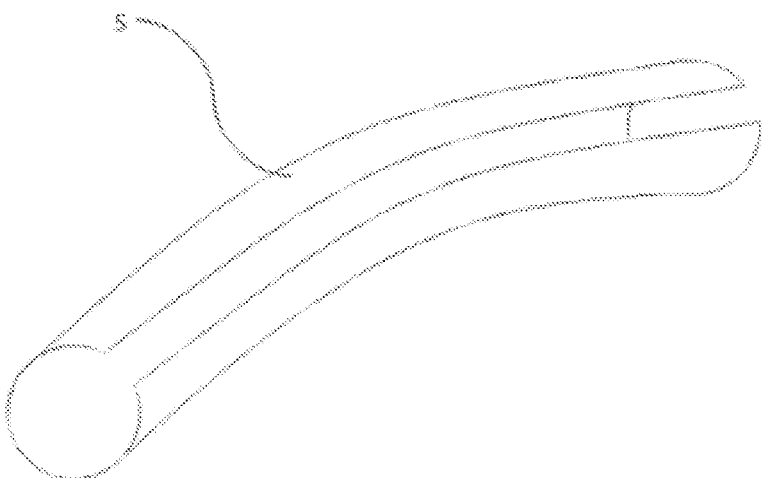
FIG. 2 is a perspective of the gripper.

The actuator mechanism (1) comprises a body (2); at least one actuator (3) made of an electro-active polymer material, which changes form depending on the electrical energy so that it triggers the body (2); at least two reinforcers (4) which allow the actuator (3) to change form, are positioned on the actuator (3) such that they remain opposite to each other, and are connected to the actuator (3) by clamping, thus transmitting movement to the body (2) (FIG. 1 and FIG. 2).

Figure 3:
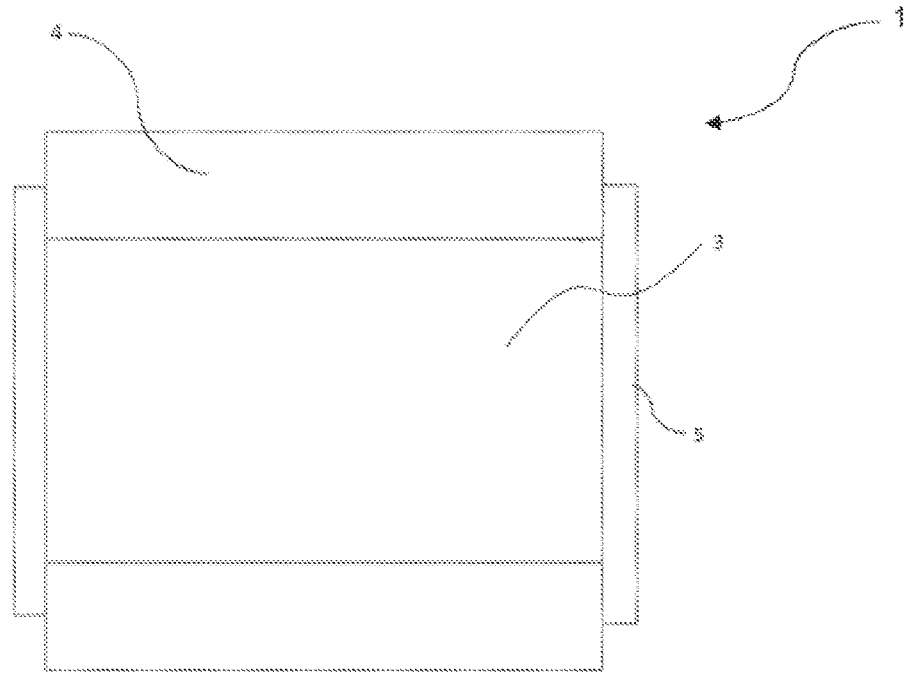
FIG. 3 is a top view of the actuator mechanism when the actuator is in the first position (I).
Figure 4:
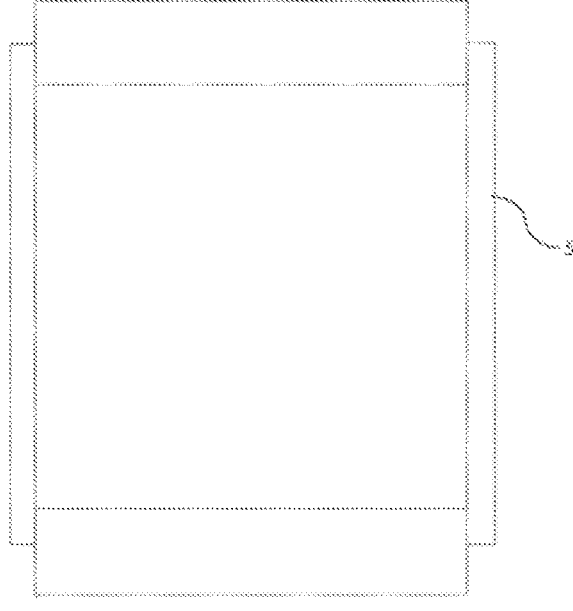
FIG. 4 is a top view of the actuator mechanism when the actuator is in the second position (II).

The actuator mechanism (1) of the invention comprises at least one gripper (5) which is located on the actuator (3) such that it is capable of changing shape, extends longitudinally between the reinforcers (4), and at least partially limits the form change of the actuator (3) (FIG. 3 and FIG. 4).

Figure 5:
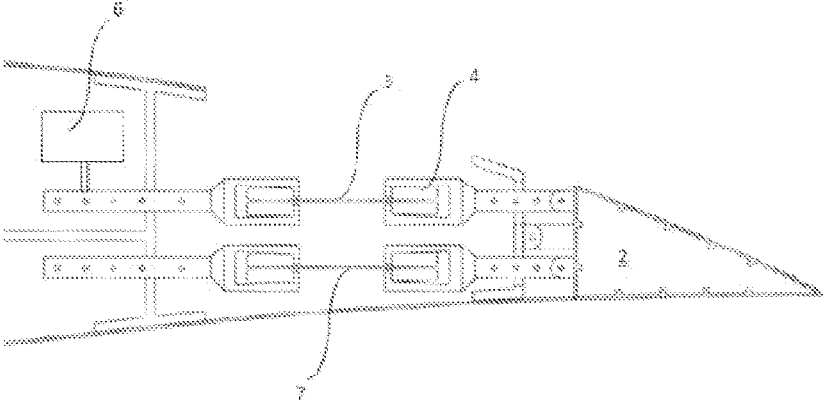
FIG. 5 is a perspective view of the body.

The actuator (3) located on the body (2) changes shape when it is exposed to an electric field. The actuator (3) located between the electrodes (7) is located longitudinally between two reinforcers (4) positioned opposite to other. The actuator (3), on which an electric field is generated by means of the electrodes (7) when triggered by the control unit (6), changes shape by expanding and contracting between the reinforcers (4) (FIG. 5).

Thanks to the gripper (5) extending longitudinally between the reinforcers (4) and preventing the energized actuator (3) from changing shape, the tendency of the actuator (3) to retract due to the internal force effect is minimized. Thus, the strength of the actuator (3) is increased. The gripper (5) allowing the actuator (3) to become at least partially flat moves in a form-fitting manner with the actuator (3).

In an embodiment of the invention, the actuator mechanism (1) comprises a first position (1) in which the actuator (3) is not electrically energised; a second position (II) in which the actuator (3) is electrically energised and is brought towards the reinforcers (4) by changing shape; a gripper (5) which resists the form change of the actuator (3) when the actuator (3) is brought from the first position (1) to the second position (II). There is a first position (1) in which no electric field is applied on the actuator (3) and the actuator (3) is in free state, and a second position (II) in which the actuator (3) extends towards the parts where it is connected to the reinforcers (4) by the application of electric field. It comprises a gripper (5) which prevents the actuator (3) from being concave inward due to the effect of internal force, while the actuator (3) changes shape, in a form-fitting manner therewith.

In an embodiment of the invention, the actuator mechanism (1) comprises a gripper (5) extending on the actuator (3) and between opposed reinforcers (4). The gripper (5) extends longitudinally between the reinforcers (4), which are positioned in an opposed manner. Thus, the gripper (5) compresses the actuator (3), and a form-fitting structure with the actuator (3) is obtained. It comprises a gripper (5) which contracts and/or expands in a form-fitting manner with the actuator (3) in the first position (1) and/or the second position (11). It comprises a gripper (5) which changes shape in a form-fitting manner with the actuator (3) when the actuator (3) is in the first position (1) and/or the second position (II).

In an embodiment of the invention, the actuator mechanism (1) comprises a plurality of grippers (5) located on the sides of the actuator (3) such that they are opposite to each other and extending longitudinally between the reinforcers (4), wherein one end of the grippers (5) is fixed to one reinforcer (4), and the other end is fixed to the other reinforcer (4). Thanks to the fact that the gripper (5) is located to cover the sides where the actuator (3) does not contact with the reinforcer (4), the gripper (5) allows the actuator (3) to change shape in a better way.

In an embodiment of the invention, the actuator mechanism (1) comprises a gripper (5) which can be produced in different geometries in a form-fitting manner with the actuator (3). The flexible gripper (5) is produced in different geometries so that an actuator (3) with a better performance is obtained.

In an embodiment of the invention, the actuator mechanism (1) comprises a gripper (5) whose surface contacting with the actuator (3) is in a serrated form, thus increasing the friction force and allowing the gripper (5) to hold onto the actuator (3). The fact that the gripper (5) has a serrated structure enables the gripper (5) to be better connected to the actuator (3).

In an embodiment of the invention, the actuator mechanism (1) comprises a gripper (5) having a concave and/or convex form upon triggering the actuator (3). The gripper (5) can change shape in different forms depending on the actuator (3).

In an embodiment of the invention, the actuator mechanism (1) comprises a gripper (5) made of an elastic material. Thus, the gripper (5) can change its form according to the shape change of the actuator (3).

In an embodiment of the invention, the actuator mechanism (1) comprises at least two electrodes (7) located on the actuator (3), which enable the actuator (3) to be energized when a voltage is applied, thus enabling formation of an electric field on the actuator (3). When voltage is applied to the electrodes (7), the actuator (3) triggered by the electric field generated on the actuator (3) changes shape between the reinforcers (4).

In an embodiment of the invention, the actuator mechanism (1) comprises an actuator (3) which is made of a dielectric elastomer material and has an elastomeric film feature.

In an embodiment of the invention, the actuator mechanism (1) comprises an actuator (3) which is made of a silicon/graphite, carbon and/or silver-based material, and thus, increasing electrical conductivity.

In an embodiment of the invention, the actuator mechanism (1) comprises a body (2) suitable for use in air and/or space vehicles.

In an embodiment of the invention, the actuator mechanism (1) comprises a control unit (6) that allows the actuator (3) to be triggered and allows the actuator (3) to change shape depending on the commands predetermined by the user.

In an embodiment of the invention, the actuator mechanism (1) comprises a body (2) suitable for use as a control surface in air and/or space vehicles.

The invention claimed is:

1. An actuator mechanism (1) configured for an air and/or space vehicle comprising a body (2), the actuator mechanism (1) comprising:
   an actuator (3) made of an electro-active polymer material which changes form depending on an electrical energy so that it triggers the body (2);
   at least two reinforcers (4) which allow the actuator (3) to change form are positioned on the actuator (3) such that they remain opposite to each other and are fixedly connected to the actuator (3) by clamping and thus transmitting movement to the body (2);
   at least one gripper (5) located and attached by clamping on the actuator (3) such that it is capable of changing shape and extends longitudinally between the at least two reinforcers (4) and at least partially limits the form change of the actuator (3).

2. The actuator mechanism (1) according to claim 1, wherein the actuator (3) has a first position (I) in which the actuator (3) is not electrically energized and a second position (II) in which the actuator (3) is electrically energized and is brought towards the at least two reinforcers (4) by changing shape; and wherein at least one of the at least one gripper (5) resists the form change of the actuator (3) when the actuator (3) is brought from the first position (I) to the second position (II).

3. The actuator mechanism (1) according to claim 1, wherein at least one of the at least one gripper (5) extends on the actuator (3) and between the at least two reinforcers (4) that are opposed to each other.

4. The actuator mechanism (1) according to claim 1, comprising a plurality of grippers (5) including the at least one gripper (5) located on the sides of the actuator (3) such that they are opposite to each other and extend longitudinally between the at least two reinforcers (4), wherein one end of each of the plurality of grippers (5) is fixed to one reinforcer (4) and the other end is fixed to the other reinforcer (4).

5. The actuator mechanism (1) according to claim 1, wherein at least one of the at least one gripper (5) having a surface contacting with the actuator (3) is in a serrated form so as to increase a friction force and allow the at least one gripper (5) to hold onto the actuator (3).

6. The actuator mechanism (1) according to claim 1, wherein at least one of the at least one gripper (5) has a concave and/or convex form upon triggering the actuator (3).

7. The actuator mechanism (1) according to claim 1, wherein at least one of the at least one gripper (5) is made of an elastic material.

8. The actuator mechanism (1) according to claim 1, comprising at least two electrodes (7) located on the actuator (3) which enable the actuator (3) to be energized when a voltage is applied and thus enable the formation of an electric field on the actuator (3).

9. The actuator mechanism (1) according to claim 1, wherein at least one of the at least one actuator (3) is made of a dielectric elastomer material and has an elastomeric film feature.

10. The actuator mechanism (1) according to claim 1, comprising a control unit (6) for triggering the actuator (3) and causing the actuator (3) to change shape depending on commands predetermined by a user.

11. The actuator mechanism (1) according to claim 1, wherein the body (2) is configured for using as a control surface in the air and/or space vehicles.

* * * * *